(12) United States Patent
Penny et al.

(10) Patent No.: US 11,177,166 B2
(45) Date of Patent: Nov. 16, 2021

(54) ETCH STOP LAYER REMOVAL FOR CAPACITANCE REDUCTION IN DAMASCENE TOP VIA INTEGRATION

(71) Applicant: International Business Machines Corporation, Armonk, NY (US)

(72) Inventors: Christopher J. Penny, Saratoga Springs, NY (US); Brent Anderson, Jericho, VT (US); Lawrence A. Clevenger, Saratoga Springs, NY (US); Robert Robison, Rexford, NY (US); Kisik Choi, Watervliet, NY (US); Nicholas Anthony Lanzillo, Wynantskill, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/851,167

(22) Filed: Apr. 17, 2020

(65) Prior Publication Data
US 2021/0327751 A1 Oct. 21, 2021

(51) Int. Cl.
*H01L 21/768* (2006.01)
*H01L 23/522* (2006.01)
(52) U.S. Cl.
CPC .. *H01L 21/76829* (2013.01); *H01L 21/76805* (2013.01); *H01L 21/76877* (2013.01); *H01L 23/5226* (2013.01)
(58) Field of Classification Search
CPC ......... H01L 21/76829; H01L 21/76877; H01L 23/5226; H01L 21/76805
See application file for complete search history.

(56) References Cited

U.S. PATENT DOCUMENTS

| 6,001,414 A | 12/1999 | Huang et al. |
| 6,133,144 A | 10/2000 | Tsai et al. |
| 6,245,663 B1 | 6/2001 | Zhao et al. |
| 6,245,669 B1 | 6/2001 | Fu et al. |
| 6,291,334 B1 | 9/2001 | Somekh |
| 6,323,121 B1 | 11/2001 | Liu et al. |

(Continued)

FOREIGN PATENT DOCUMENTS

KR 20020016098 A 3/2002

*Primary Examiner* — Shahed Ahmed
*Assistant Examiner* — Vicki B. Booker
(74) *Attorney, Agent, or Firm* — Cantor Colburn LLP; Randall Bluestone

(57) ABSTRACT

A method of forming an interconnect structure includes forming at least one second-level interconnect in a sacrificial dielectric layer that is formed on an upper surface of a sacrificial etch stop layer, and removing the sacrificial dielectric layer and the sacrificial etch stop layer while maintaining the at least one second-level interconnect so as to expose an underlying dielectric layer. The method further includes depositing a replacement dielectric layer on an upper surface of the underlying dielectric layer to embed the at least one second-level interconnect in the replacement dielectric layer. Accordingly, an interconnect structure can be formed that includes one or more first-level interconnect in a dielectric layer and one or more second-level interconnects in a replacement dielectric layer stacked on the dielectric layer. The replacement dielectric layer directly contacts the dielectric layer.

17 Claims, 2 Drawing Sheets

(56) References Cited

U.S. PATENT DOCUMENTS

| | | |
|---|---|---|
| 6,423,645 B1 | 7/2002 | Wei et al. |
| 6,424,044 B1 | 7/2002 | Han et al. |
| 6,503,827 B1 * | 1/2003 | Bombardier ...... H01L 21/76834 |
| | | 257/E21.583 |
| 6,562,711 B1 | 5/2003 | Powers |
| 6,994,949 B2 | 2/2006 | Lee et al. |
| 7,547,669 B2 | 6/2009 | Lee |
| 8,611,055 B1 | 12/2013 | Pakala et al. |

* cited by examiner

ETCH STOP LAYER REMOVAL FOR CAPACITANCE REDUCTION IN DAMASCENE TOP VIA INTEGRATION

BACKGROUND

The present invention generally relates to fabrication methods and resulting structures for integrated circuits (ICs), and more specifically, to fabrication methods and resulting interconnect structures of ICs.

The use of very large scale integration (VLSI) or ultra large scale integration (ULSI) in the fabrication of ICs requires the manufacture of sophisticated interconnect structures including conductive wiring interconnect networks that connect individual devices in a semiconductor chip to one another. Typically, the wiring interconnect networks include two types of interconnect elements (often simply referred to as interconnects) that serve as electrical conductors, namely, conductive line features (also referred to as "conductive lines") that traverse a distance across the chip, and conductive via features (also referred to as "conductive vias") that connect the conductive lines at different levels. The conductive lines and conductive vias are made of conductive material, such as aluminum or copper, and are electrically insulated by interlayer dielectrics (ILD).

SUMMARY

Embodiments of the invention are directed to a method for forming an interconnect structure. The method includes forming at least one second-level interconnect in a sacrificial dielectric layer that is formed on an upper surface of a sacrificial etch stop layer, and removing the sacrificial dielectric layer and the sacrificial etch stop layer while maintaining the at least one second-level interconnect so as to expose an underlying dielectric layer. The method further includes depositing a replacement dielectric layer on an upper surface of the underlying dielectric layer to embed the at least one second-level interconnect in the replacement dielectric layer Embodiments of the invention are directed to a method for forming a wiring interconnect network included in an interconnect structure. A non-limiting example of the method includes forming a sacrificial etch stop layer on an upper surface of a dielectric layer to cover at least one first-level interconnect embedded in the dielectric layer, and forming a sacrificial dielectric layer on an upper surface of the sacrificial etch stop layer. The method further includes forming at least one second-level interconnect that extends through the sacrificial dielectric layer and sacrificial etch stop layer to contact the at least one first-level interconnect, and removing the sacrificial dielectric layer and sacrificial etch stop layer while preserving the at least one second-level interconnect. The method further includes depositing a replacement dielectric layer on an upper surface of the dielectric layer to cover the at least one first-level interconnect and embed the at least one second-level interconnect in the replacement dielectric layer.

Embodiments of the invention are directed to an interconnect structure. The interconnect structure includes one or more first-level interconnect in a dielectric layer and one or more second-level interconnects in a replacement dielectric layer stacked on the dielectric layer. The replacement dielectric layer directly contacts the dielectric layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
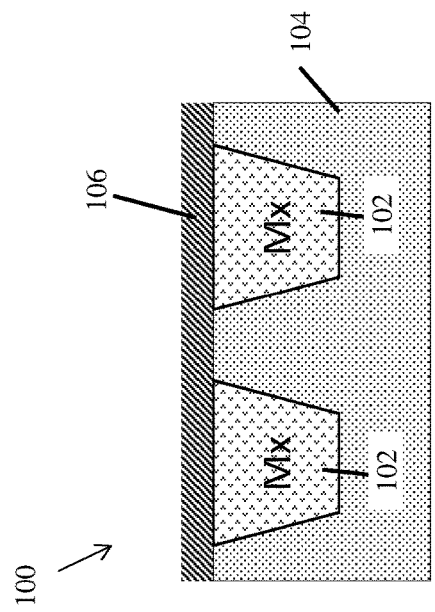
FIG. 1 depicts a cross-sectional view of an intermediate interconnect structure including first-level interconnects formed in a dielectric layer according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular interconnect architecture, embodiments of the invention are not limited to the particular interconnect architectures or materials described in this specification. Rather, embodiments of the present invention are capable of being implemented in conjunction with any other type of interconnect architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage.

Layers of interconnections (e.g., metallization layers) include conductive lines that are formed above the logical and functional layers during the BEOL stage to complete the IC. Most ICs need more than one metallization, and as many as 5-12 layers can be formed in the BEOL process. The various BEOL layers and/or individual conductive lines are interconnected by conductive vias. The combination of conductive lines and conductive vias form a wiring interconnect network that establishes all the necessary connections of the interconnect structure.

In multilayered interconnect structures described herein, "M" layers (e.g., M1 layer, M2 layer, etc.) denote metal line layers, while "V" layers denote conductive vias formed between adjacent M layers (e.g., V1 is between the M1 and M2 layers). As used herein, a "top via" refers to a "Vx" layer via which is integrally formed from patterning the line below (an "Mx" layer) and which electrically couples the line below (an "Mx" layer) to a line above (an "Mx+1" layer).

Insulating dielectric materials are used throughout the layers of an IC to perform a variety of functions, including stabilizing the IC structure and providing electrical isolation of the IC elements. For example, one or more conductive lines in the BEOL region of the IC are isolated by dielectric layers to prevent the conductive lines from creating a short circuit. One or more conductive vias are typically formed in the dielectric layers to establish a connection between a conductive line formed at a first layer and another conductive line formed at a second layer.

The continued scaling of semiconductor devices has resulted in challenging fabrication requirements, especially when fabricating ever smaller metallization layers. To increase the number of circuits that can be provided on a chip, the semiconductor industry has repeatedly shrunk the transistor gate length and the chip size. As a consequence, the interconnect structure that forms the metallic circuitry has also shrunk. As the integrated circuit (IC) footprint continues to decrease, structural elements (lines, vias, etc.) and spacing tolerances (i.e., feature to feature spacing) also decrease, complicating the manufacturing process.

Fabricating intricate elements (e.g., conductive lines and vias) of interconnect structures within increasingly smaller wafer footprints is one of the most process-intensive and cost-sensitive portions of semiconductor IC fabrication. Advanced BEOL processes incorporate phase-shifting, optical proximity correction, and other practices to satisfy these scaling demands, and can achieve a line to line pitch below 30 nm. There are challenges, however, in fabricating advanced interconnects having a line to line pitch below 30 nm. For example, high-k etch stop layers are typically interposed between a given pair of dielectric layers to properly etch the conductive vias. However, reducing the footprint of the interconnect structures increases an undesirable capacitance effect resulting from electrical interactions between the metal lines, the high-k etch stop layer, and the dielectric layers.

In addition, conventional fabrication processes used to form an interconnect structure typically deposit a second dielectric layer on the underlying dielectric layer, and then perform via/line trench and fill operations to form a conductive via and/or line in the second dielectric layer. The trench and fill operations, however, cause defects (e.g., cracks and weakened portions) in the second dielectric layer. These defects undesirably increase the dielectric constant of the second dielectric layer. As a result, the actual dielectric constant of the dielectric layer can vary or deviate from the intended or targeted dielectric constant.

Turning now to an overview of aspects of the present invention, one or more embodiments of the invention address the above-described challenges of the prior art by providing a new interconnect structure and a method fabricating the same, which excludes the conventional high-k etch stop layer between a stack of dielectric layers or metallization layers. In this manner, the undesirable capacitance effect produced by conventional interconnect devices can be significantly reduced or even eliminated altogether.

In addition, the interconnect structure according to embodiments of the invention described herein includes a replacement dielectric layer that embeds a conductive via therein. Because the replacement dielectric layer is deposited after formation of the conductive via, the replacement dielectric layer is not susceptible to damage caused by the conventional via/line formation processes. In this manner, a targeted dielectric constant value of the replacement dielectric layer can be maintained.

Turning now to a more detailed description of aspects of the present invention, FIG. 1 depicts a cross-sectional view of an intermediate interconnect structure 100 following one or more processing operations according to one or more embodiments of the invention. In the present specification and claims, an "intermediate" interconnect structure is defined as an interconnect structure in a stage of fabrication prior to a final stage.

Known fabrication operations have been used to form the interconnect structure 100 such that it includes one or more first-level interconnects 102 in a dielectric layer 104. The first-level interconnects 102 can include, but are not limited to, conductive lines and conductive vias. Although the first-level interconnects are described as conductive lines 102 going forward, it should be appreciated that one or more conductive vias can be formed in the dielectric layer 104. Further, while only two conductive lines 102 are shown, it should be appreciated that less or more conductive lines 102 can be included in the dielectric layer 104 without departing from the scope of the invention. The conductive lines 102 includes a conductive material formed or deposited in a trench in the dielectric layer 104 using known back-end-of-line (BEOL) processes. In some embodiments of the invention, the conductive lines 102 are overfilled above a surface of the trench (not shown), forming overburdens that can be removed using, for example, a chemical-mechanical planarization (CMP) process.

The conductive lines 102 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive lines 102 are copper lines (copper interconnects). The conductive lines 102 can be formed or deposited using, for example, CVD, PECVD, PVD, sputtering, plating, chemical solution deposition, and electroless plating. In one or more embodiments of the invention, the conductive lines have a width extending parallel with the upper surface of the dielectric layer 104 ranging from about 5 nm to about 20 nm and a height extending orthogonal with respect to the width ranging from about 10 nm to about 50 nm The dielectric layer 104 (sometimes referred to as an interlayer dielectric) serves as an isolation structure for electrically conductive elements formed therein (e.g., conductive lines, via, etc.). The dielectric layer 104 can be made of any suitable dielectric material, such as, for example, low-k dielectrics (materials having a small dielectric constant relative to silicon dioxide, i.e., less than about 3.9), porous silicates, carbon doped oxides, silicon dioxides, silicon nitrides, silicon oxynitrides, silicon carbide (SiC), or other dielectric materials. Any known manner of forming the dielectric layer 104 can be utilized, such as, for example, CVD, PECVD, ALD, flowable CVD, spin-on dielectrics, or PVD.

Figure 2:
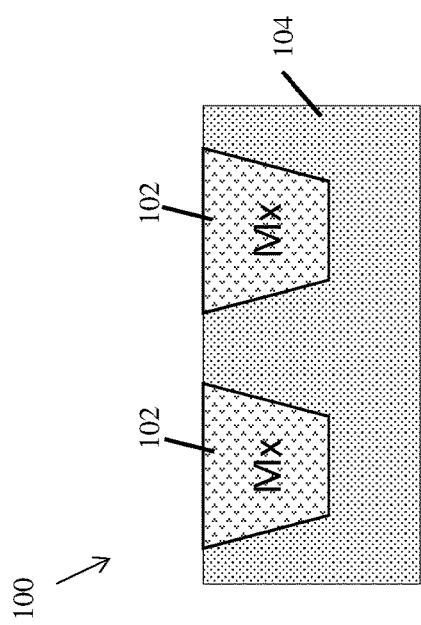
FIG. 2 depicts a cross-sectional view of the interconnect structure after forming a sacrificial etch stop layer that covers the first-level interconnects according to one or more embodiments of the invention.

Turning to FIG. 2, the interconnect structure 100 is illustrated after forming a sacrificial etch stop layer 106 that covers the conductive lines 102 according to one or more embodiments of the invention. The sacrificial etch stop layer 106 can be made of, for example, a high-k material. As used herein, high-k materials are those having a large dielectric constant relative to silicon dioxide, i.e., more than about 3.9, and preferably more than about 7.0. In one or more non-limiting embodiments of the invention, the sacrificial etch stop layer 106 is formed directly on an upper surface of the dielectric layer 104 using, for example, CVD, PECVD, ALD, flowable CVD, spin-on dielectrics, or PVD.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the sacrificial etch stop layer 106 can be formed or deposited to a thickness of about 0.5 nm to about 25 nm, for example 10 nm, although other thicknesses are within the contemplated scope of the invention. By forming the sacrificial etch stop layer 106 from a high-k material, a selective etching process can be performed that allows the sacrificial etch stop layer 106 to be subsequently etched away and removed while preserving one or more remaining elements of the interconnect structure 100.

Figure 3:
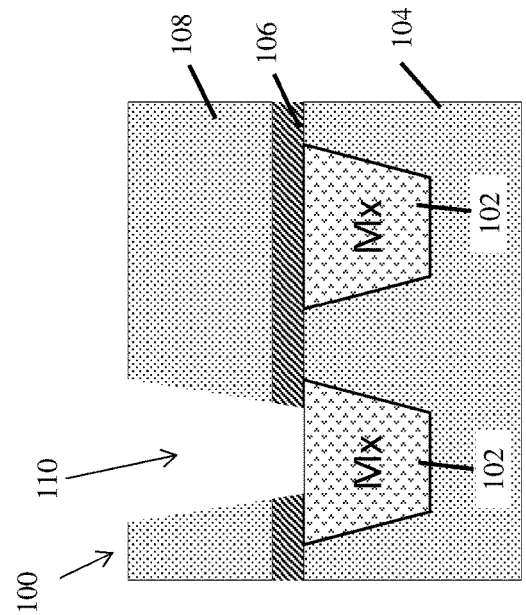
FIG. 3 depicts a cross-sectional view of the interconnect structure following deposition of a sacrificial dielectric layer on an upper surface of the sacrificial etch stop layer according to one or more embodiments of the invention.

Referring to FIG. 3, the interconnect structure 100 is illustrated following deposition of a sacrificial dielectric layer 108 on an upper surface of the sacrificial etch stop layer 106 according to one or more embodiments of the invention. The sacrificial dielectric layer 108 can be made of a low-k dielectric material (e.g., materials having a small dielectric constant relative to silicon dioxide, i.e., less than about 3.9), porous silicates, carbon doped oxides, silicon dioxides, silicon nitrides, silicon oxynitrides, silicon carbide (SiC), or other dielectric materials. Any known manner of forming the sacrificial dielectric layer 108 can be utilized, such as, for example, CVD, PECVD, ALD, flowable CVD, spin-on dielectrics, or PVD. By forming the sacrificial dielectric layer 108 from a low-k material, a selective etching process can be performed that allows the sacrificial dielectric layer 108 to be subsequently etched away and removed while preserving the underlying sacrificial etch stop layer 106.

Figure 4:
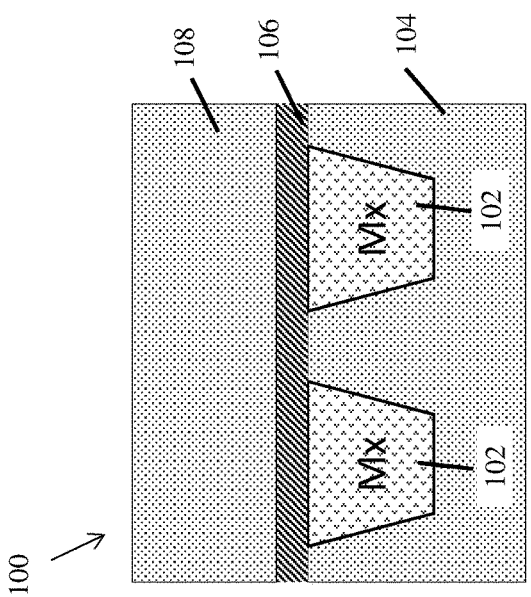
FIG. 4 depicts a cross-sectional view of the interconnect structure after forming a trench in the sacrificial dielectric layer according to one or more embodiments of the invention.

Turning now to FIG. 4, the interconnect structure 100 is illustrated after forming a trench 110 in the sacrificial dielectric layer 108 according to one or more embodiments of the invention. In some embodiments of the invention, portions of the sacrificial dielectric layer 108 and portions of the sacrificial etch stop layer 106 are removed (patterned) to form the trench 110, which exposes a surface of one or more conductive lines 102. In one or more embodiments of the invention, the trench 110 has a width extending parallel with the upper surface of the sacrificial dielectric layer 108 ranging from about 5 nm to about 20 nm and a height extending orthogonal with respect to the width ranging from about 10 nm to about 50 nm The sacrificial dielectric layer 108 and the sacrificial etch stop layer 106 can be patterned using a wet etch, a dry etch, or a combination of sequential wet and/or dry etches. In some embodiments of the invention, the sacrificial dielectric layer 108 is removed selective to the sacrificial etch stop layer 106 and the exposed portion of the sacrificial etch stop layer 106 is removed to expose the surface of an underlying conductive line 102. In one or more non-limiting embodiments of the invention, an etching processes including fluorine-containing chemistries can etch low-k materials such as, for example, $SiO_2$, selective to etch stop materials such as, for example, AN.

Figure 5:
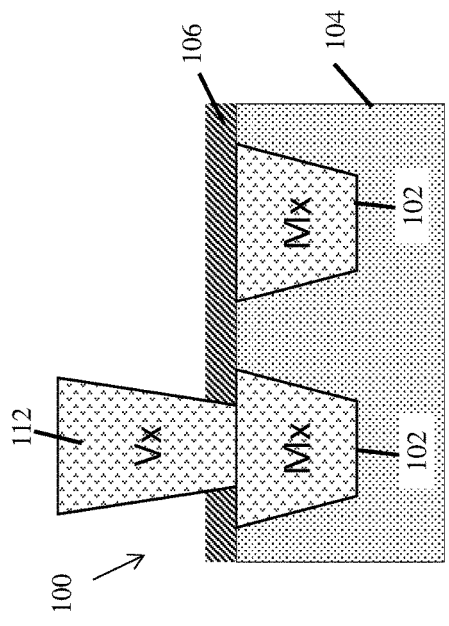
FIG. 5 depicts a cross-sectional view of the interconnect structure after filling the trench with a conductive material to form a second-level interconnect according to one or more embodiments of the invention.

Referring to FIG. 5, the interconnect structure 100 is illustrated after filling the trench 110 with a conductive material according to one or more embodiments of the invention. Accordingly, a second-level interconnect 112 is formed at a second level of the interconnect structure 100. The second-level interconnect 112 can include, but is not limited to, a conductive via and/or a conductive line. Although the second-level interconnect is described as conductive via 112 going forward, it should be appreciated that one or more conductive lines can be formed in the second-level of the interconnect structure. Further, while only one conductive via 112 is shown, it should be appreciated that more conductive vias 112 can be formed without departing from the scope of the invention.

In one or more non-limiting embodiments of the invention, the conductive via 112 can be formed by filling the trench 110 with a conductive material. Accordingly, the conductive via 112 can be formed such that it directly contacts one or more underlying conductive lines 102. Although a conductive via 112 is described above, it should be appreciated that similar processes can be used to form a conductive line in the sacrificial dielectric layer 108.

In one or more non-limiting embodiments of the invention, the metal material of the conductive via includes, but is not limited to, copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive via 112 is formed from a same material as the conductive line 102. For example, the conductive via 112 and the conductive line 102 can be made cobalt or ruthenium. In some embodiments of the invention, the conductive via 112 and the conductive line 102 are made of different conductive materials. For example, the conductive via 112 can be made cobalt or ruthenium and the conductive line 102 can be made of copper. In some embodiments of the invention, the trench 110 is overfilled above a surface of the sacrificial dielectric layer 108, forming overburdens that can be removed using, for example, a CMP process. Accordingly, the upper surface of the conductive via 112 can be formed flush (i.e., co-planar) with respect to the upper surface of the sacrificial dielectric layer 108.

Figure 6:
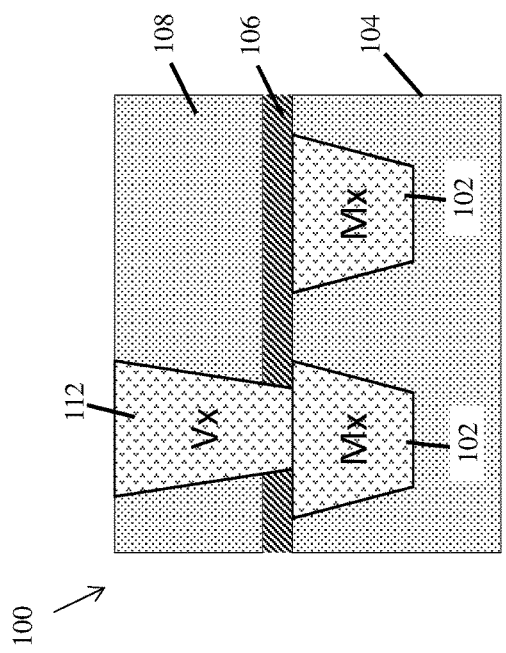
FIG. 6 depicts a cross-sectional view of the interconnect structure after removing the sacrificial dielectric layer according to one or more embodiments of the invention.

Turning now to FIG. 6, the interconnect structure 100 is illustrated after removing the sacrificial dielectric layer 108 (see FIG. 5) according to one or more embodiments of the invention. In one or more non-limiting embodiments of the invention, the sacrificial dielectric layer 108 is removed using a wet etch, a dry etch, or a combination of sequential wet and/or dry etches. In some embodiments of the invention, the sacrificial dielectric layer 108 is removed selective to the conductive via 112 and the selective etch stop layer 106. In one or more non-limiting embodiments of the invention, an etching process including fluorine (F)-containing chemistries can etch dielectrics such as low-k dielectrics, for example, selective to high-k materials and metal materials. Accordingly, the upper surface of the sacrificial etch stop layer 106 is exposed, along with a portion of the sidewalls and upper surface of the conductive via 112.

Figure 7:
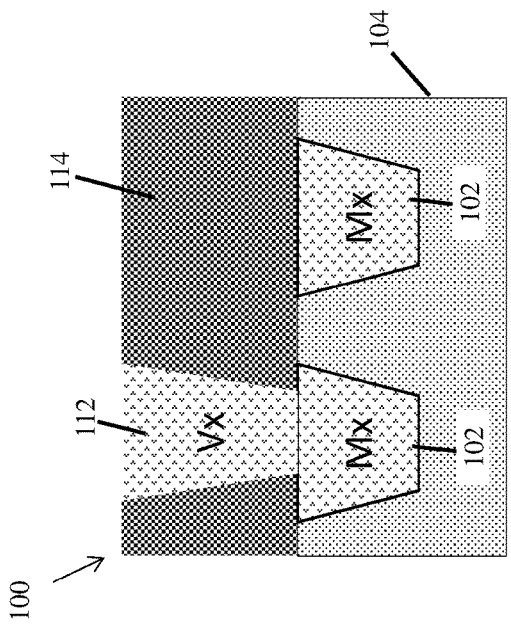
FIG. 7 depicts a cross-sectional view of the interconnect structure after removing the sacrificial etch stop layer to expose the underlying first-level interconnects according to one or more embodiments of the invention.

Referring to FIG. 7, the interconnect structure 100 is illustrated after removing the sacrificial etch stop layer 106 (see FIG. 6) according to a non-limiting embodiment of the invention. In one or more non-limiting embodiments of the invention, the sacrificial etch stop layer 106 is removed selective to the conductive via 112, the underlying dielectric layer 104, and the conductive lines 102. In one or more non-limiting embodiments of the invention, an etching process including a modified fluorine (F)-containing chemistry can etch the sacrificial etch stop layer 106 selective to the conductive via 112. Accordingly, the sidewalls and upper surface of the conductive via 112 are completely exposed, along with surfaces of the conductive lines 102 and the dielectric layer 104.

Figure 8:
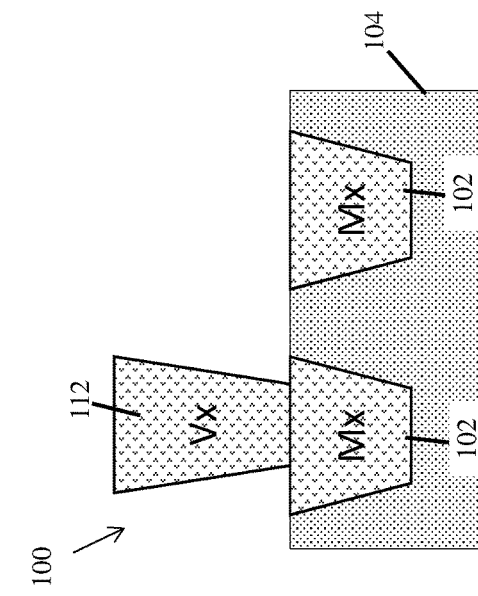
FIG. 8 depicts a cross-sectional view of a completed interconnect structure following deposition of a replacement dielectric layer that covers the second-level interconnect and first-level interconnects according to one or more embodiments of the invention.

Turning now to FIG. 8, the interconnect structure 100 is illustrated following deposition of a replacement dielectric layer 114 according to a non-limiting embodiment of the invention. In one or more non-limiting embodiments of the invention, the replacement dielectric layer 114 is deposited directly on the upper surface of the dielectric layer 104 to cover the conductive lines 102 and embed the conductive via 112 therein. The replacement dielectric layer 114 can be deposited using, for example, CVD, PECVD, ALD, flowable CVD, spin-on dielectrics, or PVD, and can be formed having any suitable thickness or height. In some embodiments of the invention, the replacement dielectric layer 114 is deposited to a height of about 50 nm above the surface of the underlying dielectric layer 104, although other heights are within the contemplated scope of the invention. In one or more non-limiting embodiments of the invention, the replacement dielectric layer 114 can be deposited at a height that extends above the conductive via 112. A CMP process can then be performed that stops on an upper surface of the conductive via 112. Accordingly, the upper surface of the conductive via 112 can be formed flush (i.e., co-planar) with respect to the upper surface of the replacement dielectric layer 114.

The replacement dielectric layer 114 can be made of various dielectric materials, such as, for example, low-k dielectrics, ultra-low-k dielectrics, porous silicates, carbon doped oxides, silicon dioxides, silicon nitrides, silicon oxynitrides, silicon carbide (SiC), or other dielectric materials. In some embodiments of the invention, the replacement dielectric layer 114 is the same material as the underlying dielectric layer 104, forming a continuous dielectric region.

As discussed previously herein, conventional techniques of forming a conductive line or via in a dielectric layer can cause defects (e.g., cracks, weakened portions, etc.) in the dielectric layer, which can undesirably increase the dielectric constant of the dielectric layer beyond a targeted dielectric constant value. Advantageously, the replacement dielectric layer 114 serves to replace the sacrificial dielectric layer 108. The replacement dielectric layer 114, however, excludes etch-induced damages or defects adjacent to (e.g., extending from or contacting the conductive via 112). That is, because the replacement dielectric layer 114 is formed after the conductive via 112, no etch-induced damages or defects are formed in the vicinity of the conductive via 112 while also allowing for the replacement dielectric layer 114 to achieve a targeted dielectric constant. In some embodiments of the invention, maintaining the targeted dielectric layer allows for forming the underlying dielectric layer 104 with a first dielectric constant value (e.g., that is less than 3.9), while forming the replacement dielectric layer 114 with a second dielectric constant value (e.g., that is less than 3.9). In other embodiments of the invention, maintaining the targeted dielectric layer allows for forming a continuous dielectric region (defined by the underlying dielectric layer 104 and the replacement dielectric layer 114) having a non-varying dielectric constant value. In some embodiments, the continuous dielectric region defined by the underlying dielectric layer 104 and the replacement dielectric layer 114 is formed of the same dielectric material. However, the dielectric constant value of the continuous dielectric region does not vary with respect to the underlying dielectric layer 104 because the replacement dielectric layer 114 is formed after the conductive via 112 such that no etch-induced damages or defects are formed therein.

As described herein, various non-limiting embodiments of the invention provide a new multilevel interconnect structure that includes a wiring interconnect network, while completely excluding an etch stop layer between a first dielectric layer at a first level and a second dielectric layer located at an immediate lower level or upper level. In this manner, the undesirable capacitance effect produced by conventional interconnect devices can be significantly reduced or even eliminated altogether.

In addition, the interconnect structure according to embodiments of the invention described herein includes a replacement dielectric layer that embeds a conductive via therein. Because the replacement dielectric layer is deposited after formation of the conductive via, the replacement dielectric layer is not susceptible to damage caused by the conventional via/line formation processes. In this manner, a targeted dielectric constant value of the replacement dielectric layer can be maintained The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," can refer to an etching process capable of etching a first element while preserving a second element or without substantially etching the second element. In other instances, the phrase "selective to" means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an interconnect structure, the method comprising:
    forming at least one second-level interconnect in a sacrificial dielectric layer that is formed on an upper surface of a sacrificial etch stop layer;
    removing the sacrificial dielectric layer and the sacrificial etch stop layer while maintaining the at least one second-level interconnect so as to expose an underlying dielectric layer; and
    depositing a replacement dielectric layer on an upper surface of the underlying dielectric layer to embed the at least one second-level interconnect in the replacement dielectric layer.

2. The method of claim 1, wherein the at least one second-level interconnect directly contacts at least one first-level interconnect formed in the underlying dielectric layer.

3. The method of claim 2, wherein the replacement dielectric layer directly contacts the underlying dielectric layer.

4. The method of claim 3, wherein the interconnect structure completely excludes an etch stop layer between the underlying dielectric layer and the replacement dielectric layer.

5. The method of claim 4, wherein the underlying dielectric layer and the replacement dielectric layer each comprise a low dielectric (low-k) material having a dielectric constant value that is less than 3.9.

6. The method of claim 5, wherein the underlying dielectric layer has a first dielectric constant value that is less than 3.9, and the replacement dielectric layer has a second dielectric constant value that is less than the first dielectric constant.

7. The method of claim 3, wherein the sacrificial etch stop layer comprises a high dielectric (high-k) material having a dielectric constant value that is greater than 7.0.

8. The method of claim 2, wherein the at least one first-level interconnect is a conductive line comprising a metal material and the at least one second-level interconnect is a conductive via comprising a metal material.

9. A method of forming a wiring interconnect network included in an interconnect structure, the method comprising:

forming a sacrificial etch stop layer on an upper surface of a dielectric layer to cover at least one first-level interconnect embedded in the dielectric layer;

forming a sacrificial dielectric layer on an upper surface of the sacrificial etch stop layer;

forming at least one second-level interconnect that extends through the sacrificial dielectric layer and sacrificial etch stop layer to contact the at least one first-level interconnect;

removing the sacrificial dielectric layer and sacrificial etch stop layer while preserving the at least one second-level interconnect; and depositing a replacement dielectric layer on an upper surface of the dielectric layer to cover the at least one first-level interconnect and embed the at least one second-level interconnect in the replacement dielectric layer.

10. The method of claim 9, wherein forming the at least one second-level interconnect comprises:

forming a trench that extends through the sacrificial dielectric layer and the sacrificial etch stop layer to expose an upper surface of the at least one first-level interconnect;

depositing a metal material in the trench to form the at least one second-level interconnect that directly contacts the upper surface of the at least one first-level interconnect.

11. The method of claim 9, wherein the interconnect structure completely excludes an etch stop layer between the dielectric layer and the replacement dielectric layer.

12. The method of claim 11, wherein the dielectric layer directly contacts the replacement dielectric layer.

13. The method of claim 9, wherein the sacrificial etch stop layer comprises a high dielectric (high-k) material having a dielectric constant value that is greater than 7.0.

14. The method of claim 13, wherein the dielectric layer and the replacement dielectric layer each comprise a low dielectric (low-k) material having a dielectric constant value that is less than 3.9.

15. The method of claim 14, wherein the dielectric layer has a first dielectric constant value that is less than 3.9, and the replacement dielectric layer has a second dielectric constant value that is less than the first dielectric constant.

16. The method of claim 9, wherein the at least one first-level interconnect is a conductive line comprising a metal material and the at least one second-level interconnect is a conductive via comprising a metal material.

17. The method of claim 9, wherein removing the sacrificial dielectric layer and sacrificial etch stop layer comprises:

performing a first selective etching process that completely removes the sacrificial dielectric layer while preserving the at least one second-level interconnect and the sacrificial etch stop layer; and performing a second selective etching process that completely removes the sacrificial etch stop layer while preserving the at least one second-level interconnect so as to expose the sidewalls and the upper surface of the at least one second-level interconnect.

* * * * *